United States Patent
de Heer et al.

(10) Patent No.: US 8,173,095 B2
(45) Date of Patent: May 8, 2012

(54) METHOD AND APPARATUS FOR PRODUCING GRAPHENE OXIDE LAYERS ON AN INSULATING SUBSTRATE

(75) Inventors: Walt A. de Heer, Atlanta, GA (US); Xiaosong Wu, Atlanta, GA (US); Michael Sprinkle, Mableton, GA (US); Claire Berger, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 593 days.

(21) Appl. No.: 12/241,555

(22) Filed: Sep. 30, 2008

(65) Prior Publication Data

US 2009/0236609 A1    Sep. 24, 2009

Related U.S. Application Data

(60) Provisional application No. 61/037,585, filed on Mar. 18, 2008.

(51) Int. Cl.
  *C01B 31/04*    (2006.01)
  *H01L 29/24*    (2006.01)
  *H01L 21/31*    (2006.01)
  *H01L 21/311*    (2006.01)

(52) U.S. Cl. . 423/448; 257/77; 257/E29.1; 257/E21.24; 257/E21.249; 438/694; 438/765

(58) Field of Classification Search ............... 423/448; 257/77, E29.1, E21.24, E21.249; 438/694, 438/765
See application file for complete search history.

(56) References Cited

U.S. PATENT DOCUMENTS

| | | | |
|---|---|---|---|
| 5,958,630 A | * | 9/1999 | Hashimoto et al. ............... 430/5 |
| 7,015,142 B2 | * | 3/2006 | DeHeer et al. .................. 438/689 |
| 2007/0092432 A1 | * | 4/2007 | Prud'Homme et al. ........ 423/448 |

OTHER PUBLICATIONS

Novoselov, et al., Electric Field Effect in Atomically Thin Carbon Films, Science 2004; 306: 666-667.*
Novoselov, et al., Supporting Data on Science Online for Electric Field Effect in Atomically Thin Carbon Films, Science 2004; 306: 666-667.*

* cited by examiner

*Primary Examiner* — Daniel C. McCracken
(74) *Attorney, Agent, or Firm* — Bryan W. Bockhop; Bockhop & Associates, LLC

(57) ABSTRACT

In a method of making a functionalized graphitic structure, a portion of a multi-layered graphene surface extending from a silicon carbide substrate is exposed to an acidic environment so as to separate graphene layers in a portion of the multi-layered graphene surface. The portion of the multi-layered graphene surface is exposed to a functionalizing material that binds to carbon atoms in the graphene sheets so that the functionalizing material remains between the graphene sheets, thereby generating a functionalized graphitic structure. The functionalized graphitic structure is dried in an inert environment.

16 Claims, 3 Drawing Sheets

METHOD AND APPARATUS FOR PRODUCING GRAPHENE OXIDE LAYERS ON AN INSULATING SUBSTRATE

CROSS-REFERENCE TO RELATED APPLICATION(S)

This application claims the benefit of U.S. Provisional Patent Application Ser. No. 61/037,585, filed Mar. 18, 2008, the entirety of which is hereby incorporated herein by reference.

STATEMENT OF GOVERNMENT INTEREST

This invention was made with government support under contract No. ECS-0404084, awarded by the National Science Foundation. The government has certain rights in the invention.

BACKGROUND OF THE INVENTION

1. Field of the Invention

The present invention relates to thin film graphitic systems and, more specifically, to a method of growing graphite oxide layers.

2. Description of the Prior Art

Graphene is a semimetal that includes a single atomically thin sheet of graphite. Ultra-thin graphitic layers on silicon carbide include one or more graphene sheets on a silicon carbide substrate. Graphene has a potential use as a material for microelectronics. However, for graphene to be useful in microelectronics applications, it must be configurable as a semiconductor. One way to accomplish this is to pattern the graphene to make nanoscopically narrow ribbons, since graphene becomes semiconducting with a band gap that is approximately inversely proportional to the width of the ribbon.

It is known that ultra-thin graphitic layers form on silicon carbide crystal substrates when the silicon carbide substrate is heated in vacuum to temperatures in the range of 1100° C. to 1600° C. In this process silicon evaporates from the surface, causing the surface to become carbon rich. Carbon on the surface converts to an ultra-thin graphitic layer, which includes one or more graphene sheets, so that an ultra-thin graphitic layer forms on the silicon carbide surface.

Experiments have demonstrated that the properties of ultra-thin graphitic layers grown on silicon carbide crystals are essentially similar to those of a single graphene sheet. It has also been demonstrated that ultra-thin graphitic layers on silicon carbide crystals can be patterned using microelectronics lithography methods to produce electronically functional structures. Consequently, as for single graphene sheet, ultra-thin graphitic layers grown on silicon carbide crystals can be used as an electronic material.

For graphene and multilayered graphene to become semiconducting so that it can be used for electronic applications, the multilayered graphene must be patterned into ribbons that are narrower than about 20 nm. Producing ribbons that are narrower than 20 nm requires non-standard nanofabrication techniques that may be difficult to implement for large-scale production.

Also, a graphene sheet that is in contact with the silicon carbide substrate, which is called the interface layer, acquires an electronic charge, whereas the other layers are substantially uncharged. Due to this charge, the conductivity of the interface layer is particularly large and therefore carries most of the current when voltages are applied to multilayered graphene ribbons. While this conducting interface layer has advantages for some applications, it is disadvantageous for many electronic device structures.

Therefore, there is a need for a method of converting a portion of a thin film graphitic structure into a semiconductor using existing lithographic techniques.

There is also a need for a silicon carbide-based graphitic layer in which the conductivity of the interface layer is reduced.

SUMMARY OF THE INVENTION

The disadvantages of the prior art are overcome by the present invention which, in one aspect, is a method of making a functionalized graphitic structure, in which a portion of a multi-layered graphene surface extending from a silicon carbide substrate is exposed to an acidic environment so as to separate graphene layers in a portion of the multi-layered graphene surface. The portion of the multi-layered graphene surface is exposed to a functionalizing material that binds to carbon atoms in the graphene sheets so that the functionalizing material remains between the graphene sheets, thereby generating a functionalized graphitic structure. The functionalized graphitic structure is dried in an inert environment.

In another aspect, the invention is a method of reducing charge density at an interface between a multi-layered graphene structure and a silicon carbide crystal. The multi-layered graphene structure that extends from the silicon carbide crystal is transformed into a multi-layered graphite oxide structure. An energy source is applied to the silicon carbide crystal and the multi-layered graphite oxide structure until a portion of the multi-layered graphite oxide structure is reduced to a multi-layered graphene.

In yet another aspect, the invention is a graphitic circuit that includes a first multi-layered graphitic structure, a multi-layered graphite oxide structure and a second multi-layered graphitic structure. The multi-layered graphite oxide structure is adjacent to the first multi-layered graphitic structure and in electrical communication with the first multi-layered graphitic structure. The second multi-layered graphitic structure is adjacent to the multi-layered graphite oxide structure and in electrical communication with the multi-layered graphite oxide structure. The second multi-layered graphitic structure is also spaced apart from the first multi-layered graphitic structure.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

BRIEF DESCRIPTION OF THE FIGURES OF THE DRAWINGS

FIG. 3A-3D are a series of schematic diagrams showing a method of making a structure including graphite oxide.

DETAILED DESCRIPTION OF THE INVENTION

Figure 1:
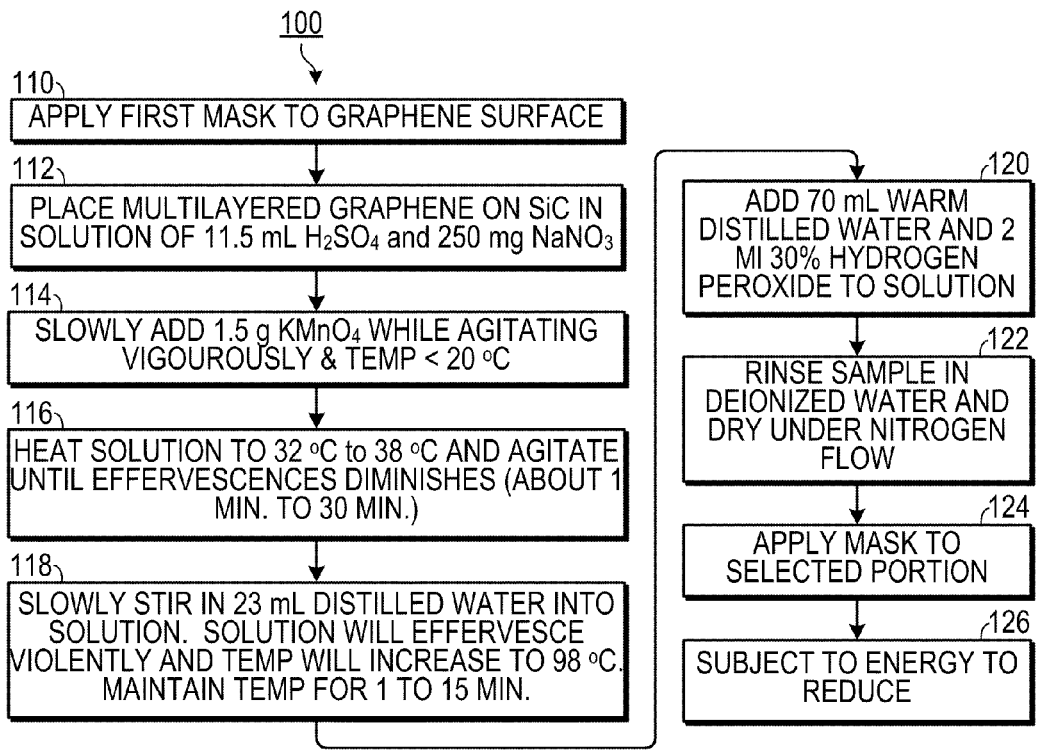
FIG. 1 is a flowchart showing a method for producing graphite oxide layers.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

Typical multilayered graphene consists of from one to 300 layers of graphene. Specifically, as used here, multilayered graphene includes at least a single graphene layer on a silicon carbide substrate. The specific way that the individual layers are stacked with respect to each other is not essential for the purposes of this invention. For example, in graphite the layers are Bernal stacked, while in multilayered epitaxial graphene grown on the C-face of silicon carbide, the stacking is rotationally disordered. The claims below apply to any stacking order of the graphene sheets in the graphene layer.

Multilayered graphene may be converted to multilayered graphene oxide by a wet chemical process. In previous systems, the conversion of graphite to graphite oxide resulted in substantial damage to the graphite structure. It is known that graphite oxide is similar to graphite in that each carbon atom is chemically bonded to three of its carbon neighbors to form a hexagonal network of carbon atoms in the form of a sheet known as graphene. Graphite is a macroscopic crystal of graphene stacks. In graphene oxide, oxygen atoms and oxygen containing molecules attach to the carbon atoms above and below the plane of the sheets. Hence oxygen atoms may form bonds with carbon without altering the multilayered graphene structure Growth of multilayered graphene grown on a silicon carbide substrate may be accomplished using several known methods, including an ultra-high vacuum method. One method of growing and patterning multilayered graphene is disclosed in U.S. Pat. No. 7,015,142, issued to de Heer et al., the entirety of which is incorporated by reference for the purposes of disclosing, inter alia, how graphene may be grown on a silicon carbide substrate and how a graphitic layer may be patterned.

Generally, a functionalized graphitic structure may be made, in one embodiment, by separating graphene layers in the graphitic structure and introducing a functionalizing material (such as oxygen, or any other material that bonds to carbon and changes an electrical property of the graphene) between the graphene layers (an action known as "intercalating"). This may be done by exposing a portion of a multilayered graphene surface to an acidic environment so as to separate graphene layers and then exposing the multi-layered graphene surface to the functionalizing material. Once the functionalizing material has been introduced, the graphitic structure is dried in an inert environment.

As shown in FIG. 1, in one specific experimental embodiment of a method 100 of converting multilayered graphene on a silicon carbide substrate to multilayered graphene oxide on silicon carbide, so as to maintain the integrity of layered structure of the multi-layered graphene on the silicon carbide substrate, a first mask may be applied to a portion of a graphene surface 110. The sample is placed 112 in a solution that includes of 11.5 mL $H_2SO_4$ and 250 mg $NaNO_3$. The beaker containing the solution can be surrounded by a crushed ice bath to maintain a low temperature. Slowly, 1.5 g of potassium permanganate ($KMnO_4$) is added 114 while the system is agitated vigorously, keeping temperature below 20° C. This solution is removed from ice bath and is then heated 116 to 35±3° C. and the solution is agitated. In this process effervescence is observed which gradually diminishes. The reaction is complete when the effervescence has substantially diminished, which occurs after about 1 to about 30 minutes.

Next, 23 mL distilled water is stirred into the solution 118. The solution will effervesce violently and its temperature will increase to about 98° C. The system is maintained at this temperature for at least one minute (in one example, for about 15 minutes). Next, 70 mL warm distilled water and 2 mL 30% hydrogen peroxide is added to the solution 120 thereby subjecting the system to a reducing environment. The hydrogen peroxide reduces the residual permanganate and manganese dioxide to produce a colorless soluble manganese sulfate solution. The sample is rinsed 122 in deionized water, and dried under a nitrogen flow. The unmasked portion of the sample includes graphene oxide.

The graphene layer at the interface of the multilayered graphene with the silicon carbide substrate is charged with a electronic charge density in the range of $10^{11}$ to $10^{13}$ electrons per square centimeter. The method 100 disclosed for producing the graphene oxide multilayer affects the silicon carbide/graphene multilayered graphene oxide interface and consequently it affects (such as reduces) the charge density of the graphene layer at the interface.

This charge density reduction may be enhanced by applying heat (or another type of energy, such as electron beam radiation) to the graphene oxide. For example, a second mask may be applied to the unmasked portion 124 and the exposed portion of the graphene oxide may be subject to heating or electron beam radiation (or another type of an energy source) to reduce the exposed portion 126. Thus, some of the multilayered graphene oxide is converted back to multilayered graphene, for example by heating a multilayered graphene oxide on silicon carbide crystal substrate in a vacuum to a temperature in the range from 100° C. to 1100° C. for a duration of from 1 second to one hour. In this process the chemically modified silicon carbide crystal substrate surface will be converted back to a silicon carbide crystal surface, thus the charge density at the surface can be significantly reduced. The reduced charge density will cause a reduced electrical conductivity, which is advantageous for certain electronic devices like top-gated field effect transistors.

Figure 2A:
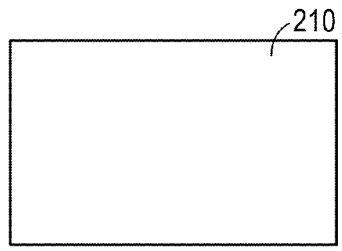
FIG. 2A is a graph showing a current-voltage characteristic of a functionalized graphitic structure made according to a first embodiment.
Figure 2B:
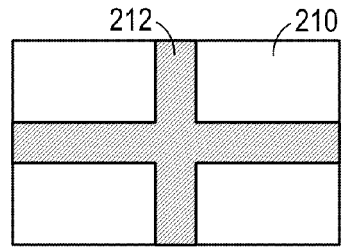
FIG. 2B is a graph showing a current-voltage characteristic of a functionalized graphitic structure made according to a second embodiment.

As shown in FIGS. 2A-D, patterned devices may be made using the methods disclosed above. As shown in FIG. 2A, a multilayered graphene surface on a silicon carbide substrate is coated with electron-beam resist material, such as hydrogen silsesquioxane 210 or a photoresist such as SU-8. The multilayered graphene and the hydrogen silsesquioxane are then exposed to the electron beam in selected areas. As shown in FIG. 2B, the pattern produced by the electron beam lithography is developed to expose the underlying multilayered graphene in the developed areas 212 but leaving the undeveloped areas covered with cured hydrogen silsesquioxane 210.

Figure 2C:
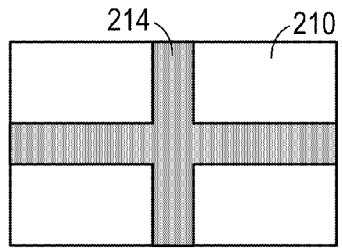
Figure 2D:
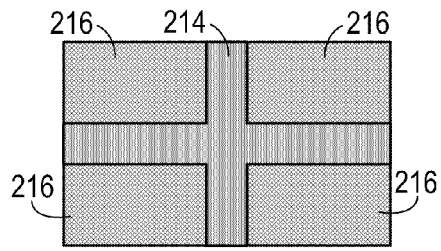

As shown in FIG. 2C, the multilayered graphene surface is then subjected to the chemical processes disclosed above, thereby creating a multilayered graphene oxide layer. However only the regions that are not covered with hydrogen silsesquioxane will be converted, resulting in a multilayered graphene oxide pattern 214. The regions that are covered with hydrogen silsesquioxane are not affected by the chemical reaction. As shown in FIG. 2D, the structure after the hydrogen silsesquioxane is removed includes regions of multilayered graphene 216 and a region of multilayered graphene oxide 214. This method can be used to produce a large variety of multilayered graphene oxide patterns on multilayered graphene. It should be noted that graphene oxide can serve as an electrical insulator so that the pattering method of this invention can be used to produce patterned graphene structures. Other lithography methods generally known to the art, such as photolithography, may also be used.

Figure 3A:
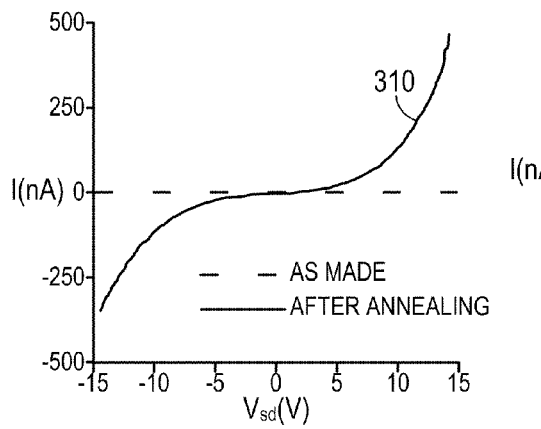

The semiconducting properties of multilayered graphene oxide and the modification of the semiconducting properties multilayered graphene oxide due to heat or due to electron beam irradiation can be probed by electrical measurements. Electrical measurements in experimental systems demonstrate that the semi-conducting properties of the graphene oxide layer are modified by heat as demonstrated by a current/voltage shown in FIG. 3A. In one experimental embodiment, a 3 μm wide 15 μm long multilayered graphene ribbon was produced by electron beam lithography methods described above. Metal electrodes were applied to either end of the ribbon. A voltage ($V_{sd}$) was applied to the electrodes and the electrical current (I) passing through the ribbon was measured. The resistance of the ribbon was found to be substantially 1000 Ohms, which is consistent with the known properties of multilayered graphene ribbons with these dimensions. A chemical mask as described above was applied to ribbon in such a way that a 3 μm by 10 μm central portion of the ribbon remained exposed. The chemical treatment of this invention was applied so that the exposed multilayered graphene ribbon segment was converted to multilayered graphene oxide. A voltage ($V_{sd}$) was applied to the electrodes and the electrical current (I) passing through the ribbon was measured.

The structure was subsequently subjected to a heat treatment consisting of heating the structure to 180° C. for 16 hours, after which a voltage ($V_{sd}$) was applied to either end of the ribbon and the current I through the ribbon was measured 310. The measurement indicated the formation of a Schottky barrier with a barrier height of 0.48 V. Thus it was concluded that there is a Schottky barrier at the junction between multilayered graphene and multilayered graphene oxide. The Schottky barrier is greater than 1 eV before the heat treatment and the Schottky barrier was reduced after the heat treatment. This result shows that the electronic properties of multilayered graphene oxide were changed by a heat treatment. The observed effect is consistent with a decrease in the band-gap of the graphene oxide. It is thought that this effect is caused by a partial conversion of graphene oxide back to graphene through a loss of oxygen, since oxygen loss by heating is known to occur in graphite oxide. The conversion is gradual and depends on the duration and temperatures involved in the heat treatment where the conversion is more complete the higher the temperature and the longer the duration of the heat treatment. Hence, the method disclosed herein provides a method to modify the semiconducting properties of multilayered graphene oxide by heating the multilayered graphene oxide to temperatures ranging from 100° C. to 1100° C. for a time in the range of 1 second to 20 hours. Multilayered graphene oxide subjected to a heat treatment for the purposes of modifying its electronic properties is referred to as thermally modified graphene oxide.

Figure 3B:
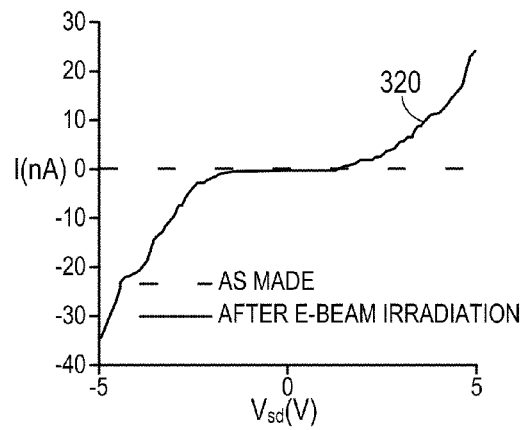

The electronic properties of the graphene oxide on a silicon carbide substrate modified by electron beam radiation are shown in FIG. 3B. Measurements were applied to a multilayered graphene ribbon sample that was substantially similar to the one described above. A voltage ($V_{sd}$) was applied to the electrodes and the electrical current (I) passing through the ribbon was measured. The measurement indicates that the resistance of the structure has become greater than $10^{11}$ Ohms. The structure was subsequently subjected to an electron beam. The electrons in the beam had an energy of 30 keV. After the electron beam irradiation, a voltage ($V_{sd}$) was applied to either end of the ribbon and the current (I) through the ribbon was measured 320. The measurement showed features that are characteristic of a Schottky barrier with a barrier height of 0.55 V. The conversion of graphene oxide to graphene is gradual and can be controlled by controlling the duration and the intensity of electron beam irradiation. Hence, the methods disclosed herein allow modification of the semiconducting properties of multilayered graphene oxide by irradiating multilayered graphene oxide with an electron beam of which the energy of the electrons in the beam is in the range of 1 eV to 100 keV. Multilayered graphene oxide subjected to electron beam radiation for the purposes of modifying its electronic properties is referred to as e-beam modified graphene oxide.

Figure 4:
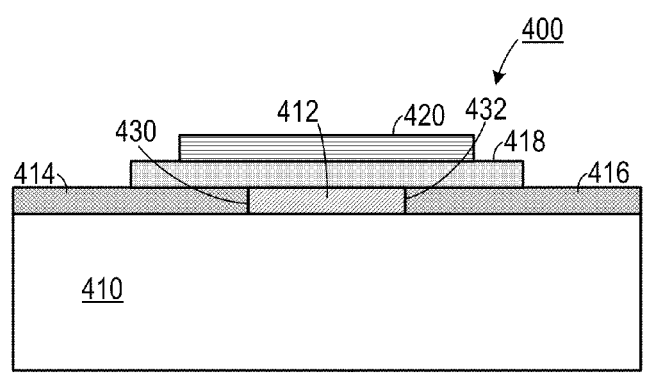
FIG. 4 is a cross-sectional schematic diagram showing a structure including graphite oxide.

One example of an electronic device, such as a field effect transistor 400, which can be made using the methods disclosed herein is shown in FIG. 4. A multilayered graphene ribbon on a silicon carbide substrate 410 is produced and a portion of the ribbon 412 is converted to multilayered graphene oxide. One end of the ribbon acts as a source electrode 414 and the other end of the ribbon is the drain electrode 416. An electrostatic gate stack can be applied to section of the ribbon that was converted to multilayered graphene oxide is converted to graphene oxide. The gate stack consists of a dielectric layer 418, for such as a thin hafnia film, on which a conductive metal layer (such as a thin aluminum film), which acts as the gate 420, is deposited.

In the field effect transistor 400 a voltage $V_{sd}$ is applied between the source 414 and the drain 416. A voltage $V_g$ is applied to the gate 420 the resistance between the source 414 and drain 416 is modified because of the effect of the fields on the Schottky barrier at the source-channel junction 430 and at the drain-channel junction 432.

Figure 5:
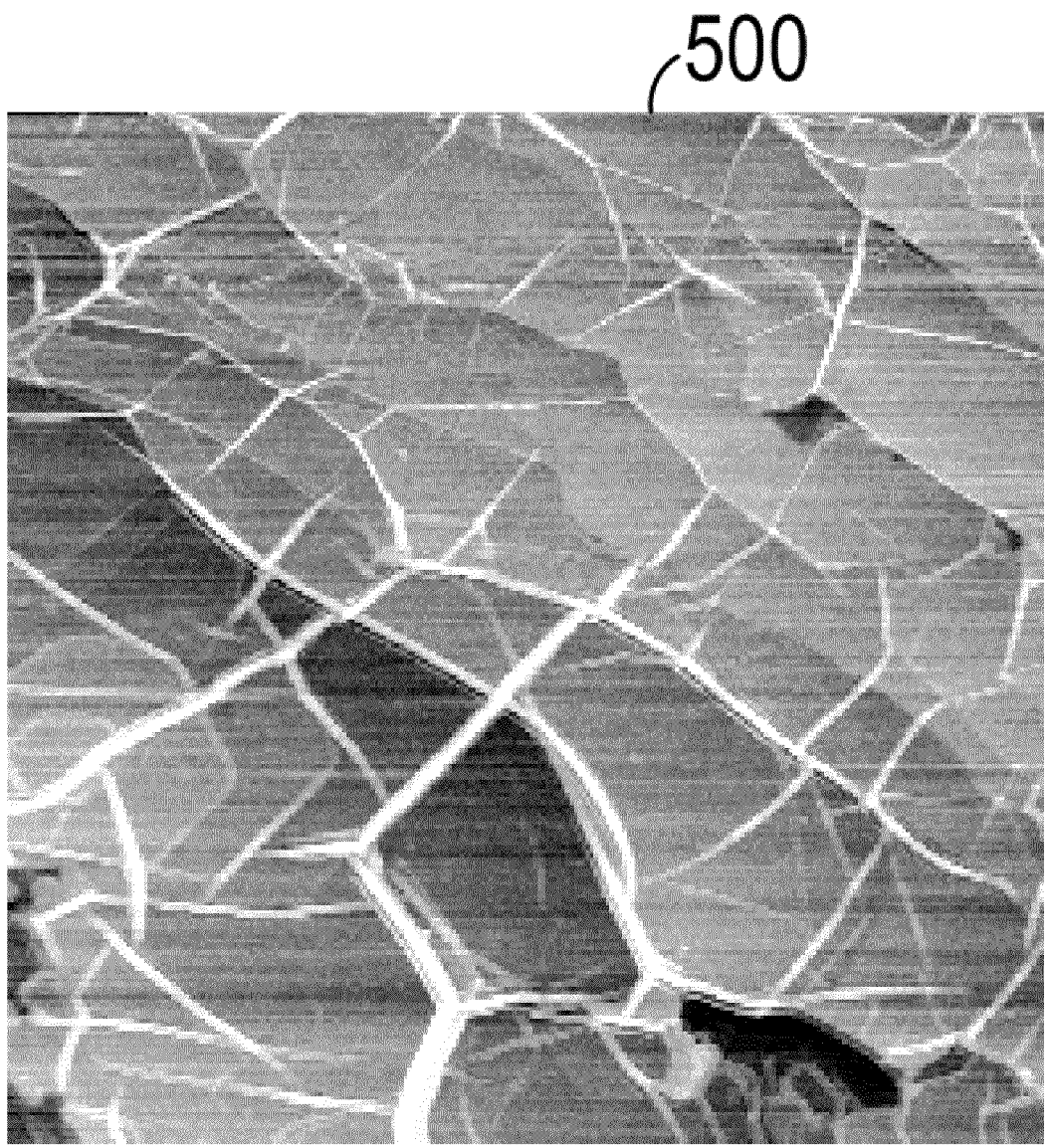
FIG. 5 is a micrograph of graphite oxide made according to a method disclosed herein.

A micrograph of a graphene oxide surface 500 is shown in FIG. 5. This graphene oxide surface 500 was made according to the methods disclosed herein. This micrograph of a multilayered graphene oxide surface 500 produced by the methods disclosed above does not show any evidence of damage. In particular, there is no evidence for tears and other distortions of the multilayered graphene oxide surface. This observation demonstrates that the methods disclosed above do not tear or otherwise significantly damage the layers.

In another embodiment, multilayered graphene oxide may be converted to thermally modified graphene oxide by utilizing a localized heat source, such as a heated atomic force microscope tip. In this way, the heated atomic force microscope tip can draw a pattern of e-beam modified graphene oxide.

In another embodiment, multilayered graphene oxide is converted to electron beam modified graphene oxide by applying a focused electron beam to a graphene oxide surface. In this way, the electron beam draws a pattern of thermally modified graphene oxide In another embodiment, modified graphene oxide can is produced using light in order to produce modified graphene oxide patterns on multilayered graphene oxide layer. Light can interact with the graphene oxide either by heating the sample or by direct stimulation of the chemical bonds in order to reduce the graphene oxide to graphene. Patterning is accomplished by applying a mask to the multilayered graphene oxide layer in such a way that light affects only those regions of the multilayered graphene oxide that are exposed through the openings in the mask.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A method of making a functionalized graphitic structure, comprising the actions of:
   a. exposing a portion of a multi-layered graphene surface extending from a silicon carbide substrate to an acidic environment so as to separate graphene layers in a portion of the multi-layered graphene surface;
   b. exposing the portion of the multi-layered graphene surface to a functionalizing material that binds to carbon atoms in the graphene sheets so that the functionalizing material remains between the graphene sheets, thereby generating a functionalized graphitic structure;
   c. drying the functionalized graphitic structure in an inert environment;
   d. subjecting a portion of the functionalized graphitic structure to a reducing environment; and
   e. applying a second masking material that resists the reducing environment to a portion of the functionalized graphitic structure prior to the action of subjecting the portion of the functionalized graphitic structure to the reducing environment.

2. The method of claim 1, wherein the action of exposing a portion of the graphitic surface to an acidic environment comprises the actions of:
   a. submerging the portion of the graphitic surface into a solution of sulfuric acid and sodium nitrate; and
   b. maintaining the solution at a temperature that is not greater than 20° C.

3. The method of claim 1, wherein the action of exposing the portion of the graphitic surface to a functionalizing material comprises the actions of:
   a. submerging the portion of the graphitic surface into a solution that includes an oxidizing agent;
   b. maintaining the solution at a temperature that is not greater than 20° C.; and
   c. agitating the solution.

4. The method of claim 3, wherein the oxidizer comprises potassium permanganate.

5. The method of claim 4, further comprising the action of rinsing the portion of the multi-layered graphene surface in water.

6. The method of claim 3, further comprising the actions of:
   a. heating the solution to a temperature that is greater than 32° C. and agitating the solution until visually perceived effervescence of the solution diminishes;
   b. adding water to the solution and allowing the solution to increase in temperature until the temperature of the solution is at least 95° C. and maintaining the solution at a temperature of at least 95° C. for at least one minute; and
   c. adding a solution of water and hydrogen peroxide to the solution, thereby terminating the reaction.

7. The method of claim 1, wherein the inert environment comprises a nitrogen flow.

8. The method of claim 1, further comprising the action of applying a first masking material to a portion of the multi-layered graphene surface prior to exposing the portion of the multi-layered graphene surface to an acidic environment, the mask material configured to inhibit contact between the portion of the multi-layered graphene surface and the acidic environment, thereby generating a patterned functionalized graphitic structure.

9. The method of claim 8, wherein the first masking material comprises a material selected from a group consisting of hydrogen silsesquioxane and SU-8 photoresist.

10. The method of claim 1, wherein the action of subjecting a portion of the functionalized graphitic structure to a reducing environment comprises applying an energy source to the portion of the functionalized graphitic structure.

11. The method of claim 1, wherein the action of subjecting a portion of the functionalized graphitic structure to a reducing environment comprises the action of applying an electron beam to the portion of the functionalized graphitic structure.

12. A method of making a functionalized graphitic structure, comprising the actions of:
   a. exposing a portion of a multi-layered graphene surface extending from a silicon carbide substrate to an acidic environment so as to separate graphene layers in a portion of the multi-layered graphene surface, wherein the action of exposing the portion of the graphitic surface to a functionalizing material comprises the actions of:
      i. submerging the portion of the graphitic surface into a solution that includes an oxidizing agent;
      ii. maintaining the solution at a temperature that is not greater than 20° C.; and
      iii. agitating the solution;
   b. exposing the portion of the multi-layered graphene surface to a functionalizing material that binds to carbon atoms in the graphene sheets so that the functionalizing material remains between the graphene sheets, thereby generating a functionalized graphitic structure, wherein the exposing the portion of the multi-layered graphene surface to a functionalizing material, comprises the actions of:
      i. heating the solution to a temperature that is greater than 32° C. and agitating the solution until visually perceived effervescence of the solution diminishes;
      ii. adding water to the solution and allowing the solution to increase in temperature until the temperature of the solution is at least 95° C. and maintaining the solution at a temperature of at least 95° C. for at least one minute; and
      iii. adding a solution of water and hydrogen peroxide to the solution, thereby terminating the reaction; and
   c. drying the functionalized graphitic structure in an inert environment.

13. The method of claim 12, further comprising the action of subjecting a portion of the functionalized graphitic structure to a reducing environment.

14. The method of claim 12, wherein the action of exposing a portion of the graphitic surface to an acidic environment comprises the actions of:
   a. submerging the portion of the graphitic surface into a solution of sulfuric acid and sodium nitrate; and
   b. maintaining the solution at a temperature that is not greater than 20° C.

15. The method of claim 12, wherein the action of exposing the portion of the graphitic surface to a functionalizing material comprises the actions of:
   c. submerging the portion of the graphitic surface into a solution that includes an oxidizing agent;
   d. maintaining the solution at a temperature that is not greater than 20° C.; and
   e. agitating the solution.

16. The method of claim 12, further comprising the action of applying a first masking material to a portion of the multi-layered graphene surface prior to exposing the portion of the multi-layered graphene surface to an acidic environment, the mask material configured to inhibit contact between the portion of the multi-layered graphene surface and the acidic environment, thereby generating a patterned functionalized graphitic structure.

* * * * *